(12) United States Patent
Cavus et al.

(10) Patent No.: US 8,937,514 B2
(45) Date of Patent: Jan. 20, 2015

(54) LOCAL OSCILLATOR (LO) DRIVER CIRCUIT FOR A MIXER

(71) Applicant: Hittite Microwave Corporation, Chelmsford, MA (US)

(72) Inventors: B. Tarik Cavus, Istanbul (TR); Abdullah Celebi, Istanbul (TR)

(73) Assignee: Hittite Microwave Corporation, Chelmsford, MA (US)

( * ) Notice: Subject to any disclaimer, the term of this patent is extended or adjusted under 35 U.S.C. 154(b) by 91 days.

(21) Appl. No.: 13/761,672

(22) Filed: Feb. 7, 2013

(65) Prior Publication Data

US 2013/0249640 A1 Sep. 26, 2013

Related U.S. Application Data

(60) Provisional application No. 61/633,415, filed on Feb. 10, 2012.

(51) Int. Cl.
*H03L 5/00* (2006.01)
*H04B 1/40* (2006.01)
*G06F 1/00* (2006.01)
*H03D 7/14* (2006.01)

(52) U.S. Cl.
CPC .. *H03L 5/00* (2013.01); *H04B 1/40* (2013.01); *G06F 1/00* (2013.01); *H03D 7/1441* (2013.01); *H03D 7/1458* (2013.01)
USPC ............. 331/109; 331/74; 333/119; 455/323; 455/326

(58) Field of Classification Search
CPC .................... H03D 2200/0088; H03D 7/1441; H03D 7/1458; H03D 7/1466; H03D 7/1483; H03D 7/165; H03D 7/125; H03H 11/1291; H03H 11/44; H03H 17/0294; H03H 19/008; H03H 19/004; H03H 2011/0494; H03H 7/38; H03H 7/463

USPC ........... 331/74, 109; 455/326, 321, 319, 318, 455/323, 359; 327/359; 333/119
See application file for complete search history.

(56) References Cited

U.S. PATENT DOCUMENTS

| | | |
|---|---|---|
| 5,060,298 A | 10/1991 | Waugh et al. |
| 5,361,409 A | 11/1994 | Vice |
| 6,653,885 B2 | 11/2003 | Wu et al. |

(Continued)

OTHER PUBLICATIONS

Written Opinion from the International Searching Authority for International Application No. PCT/US13/25114, mailed Apr. 22, 2013, 2 pgs. (unnumbered).

*Primary Examiner* — Arnold Kinkead
(74) *Attorney, Agent, or Firm* — Knobbe, Martens, Olson & Bear, LLP

(57) ABSTRACT

An improved local oscillator (LO) driver circuit for a mixer, the LO driver circuit includes a gain circuit responsive to LO input signals at a predetermined LO frequency range. At least a first pair of a parallel combination of a resistor and a capacitor is coupled to the gain circuit and to LO inputs of the mixer. The resistor configured to increase impedance at low frequencies of the frequency range and the capacitor is configured to reduce the impedance of the first parallel combination at high frequencies of the frequency range to reduce resistive impendence of the resistor. At least a second pair of a parallel combination of a low quality factor inductor and a high quality factor inductor is connected to the first pair. The second pair in serial combination with the first pair is tuned to provide a constant desired load impedance and a constant desired voltage swing at the LO inputs of the mixer over the predetermined LO frequency range.

21 Claims, 12 Drawing Sheets

(56) References Cited

U.S. PATENT DOCUMENTS

| | | |
|---|---|---|
| 7,580,693 B2 | 8/2009 | Rohde et al. |
| 7,880,557 B2 | 2/2011 | Jiang |
| 7,904,037 B2 | 3/2011 | Rofougaran et al. |
| 8,145,155 B2 * | 3/2012 | Pullela et al. ............... 455/118 |
| 2010/0271122 A1 | 10/2010 | Masuda et al. |

* cited by examiner

LOCAL OSCILLATOR (LO) DRIVER CIRCUIT FOR A MIXER

RELATED APPLICATIONS

This application hereby claims the benefit of and priority to U.S. Provisional Application Ser. No. 61/633,415, filed on Feb. 10, 2012, under 35 U.S.C. §§119, 120, 363, 365, and 37 C.F.R. §1.55 and §1.78, which is incorporated by reference herein.

FIELD OF THE INVENTION

This invention relates to an improved local oscillator (LO) driver circuit for a mixer.

BACKGROUND OF THE INVENTION

Mixers are often used in radio frequency (RF) systems and microwave systems to down or up convert RF signals to an intermediate frequency (IF) signals. U.S. Pat. No. 7,880,557, incorporated by reference herein, discloses a double balanced mixer which may utilize a hybrid balun; U.S. Pat. No. 5,060,208, incorporated by reference herein, discloses monolithic double balanced mixer which may employ an active distributed element balun; U.S. Pat. No. 6,653,885, incorporated by reference herein, teaches an on-chip integrated mixer with a balun circuit; U.S. Pat. No. 5,361,409, incorporated by reference herein, discloses a FET mixer which requires low local oscillator power levels and high third order intercepts; and U.S. Pat. No. 7,580,693, incorporated by reference herein, teaches a passive reflection mixer, such as a single, double, or triple balanced mixer that utilize FETs.

Active mixers typically rely on analog circuitry to produce the IF signal while passive mixers typically utilize switching transistors to create the IF signal.

In either case, the IF frequency may be achieved by injecting a local oscillator (LO) signal into the mixer with a LO driver circuit. The LO driver circuit needs to provide a sufficiently large constant peak-to-peak voltage swing at the LO inputs to the mixer to obtain good high third order intercept point (IP3) and conversion gain. The large constant peak-to-peak voltage swing at the LO inputs is difficult to achieve over broad frequency ranges using conventional LO driver circuits. In order to maintain the needed peak-to-peak voltage swing, conventional LO driver circuits are often inductively loaded with a single pair of inductors, or a center tapped transformer, with series D-Q resistors to define the low frequency gain and overall bandwidth. However, parasitics associated with the switching devices and the inductors reduce the output impedance and corresponding peak-to-peak gain of the LO driver circuit as the input frequency increases. As a result, conventional LO driver circuits may have poor swing behavior of the voltage at the LO inputs to the mixer as the LO frequency increases. Additionally, as the voltage swing at the LO inputs to the mixer changes with frequency, conventional passive mixers often rely on changing the control voltage of the mixer for each frequency to obtain the best IP3 and conversion gain. Such a technique is cumbersome and requires interaction by a user.

SUMMARY OF THE INVENTION

In one aspect, an improved local oscillator (LO) driver circuit for a mixer is featured. The LO driver circuit includes a gain circuit responsive to LO input signals at a predetermined LO frequency range, at least a first pair of a parallel combination of a resistor and a capacitor coupled to the gain circuit and to LO inputs of the mixer, the resistor configured to increase impedance at low frequencies of the frequency range and the capacitor configured to reduce the impedance of the first parallel combination at high frequencies of the frequency range, and at least a second pair of a parallel combination of a low quality factor inductor and a high quality factor inductor connected to the first pair, the second pair in serial combination with the first pair tuned to provide a constant desired load impedance and a constant desired voltage swing at the LO inputs of the mixer over the predetermined LO frequency range.

In one embodiment, each low quality factor inductor of the second pair may have a predetermined inductance and predetermined parasitics. The low quality factor inductors, of the second pair may be inductively coupled to each other. Each high quality factor inductor of the second pair may have a predetermined inductance and predetermined parasitics. The high quality factor inductors of the second pair may be inductively coupled to each other. Each capacitor of the first pair may have a predetermined capacitance and predetermined parasitics. The LO driver circuit may include a resistor connected in series with each low quality factor inductor tuned to provide the constant desired load impedance and the constant desired voltage swing. The resistor may have a predetermined resistance and predetermined parasitics. The predetermined LO frequency range may include a frequency range in the range of about 400 MHz to about 10 GHz. The predetermined LO range may include a frequency range of about 600 MHz to about 3.5 GHz. The constant desired voltage swing may include a single-ended peak-to-peak voltage in the range of about 1 V to about 3 V.

In another aspect, an improved local oscillator (LO) driver circuit for a mixer is featured. The LO driver circuit includes a gain circuit responsive to LO input signals at a predetermined LO frequency range, at least a first pair of a parallel combination of a resistor and a capacitor coupled to the gain circuit and to LO inputs of the mixer, the resistor configured to increase impedance at low frequencies of the frequency range and the capacitor configured to reduce the impedance of the parallel combination at high frequencies of the frequency range, and at least a second pair of a parallel combination of a high quality factor inductor connected in parallel with a series combination of a low quality factor inductor and a resistor connected to the first pair, the second pair in serial combination with the first pair tuned to provide a constant desired load impedance and a constant desired voltage swing of the signals at the LO inputs of the mixer over the predetermined LO frequency range.

In one embodiment, each low quality factor inductor of the second pair may have a predetermined inductance and predetermined parasitics. The low quality factor inductors, of the second pair may be inductively coupled to each other. Each high quality factor inductor of the second pair may have a predetermined inductance and predetermined parasitics. The high quality factor inductors of the second pair may be inductively coupled to each other. Each capacitor of the first pair may have a predetermined inductance and predetermined parasitics. The resistor may have a predetermined resistance and predetermined parasitics. The predetermined LO frequency range may include a frequency range in the range of about 400 MHz to about 10 GHz. The predetermined LO range may include a frequency range of about 600 MHz to about 3.5 GHz. The desired constant voltage swing may include a single-ended peak-to-peak voltage in the range of about 0.5 to about 3 V.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
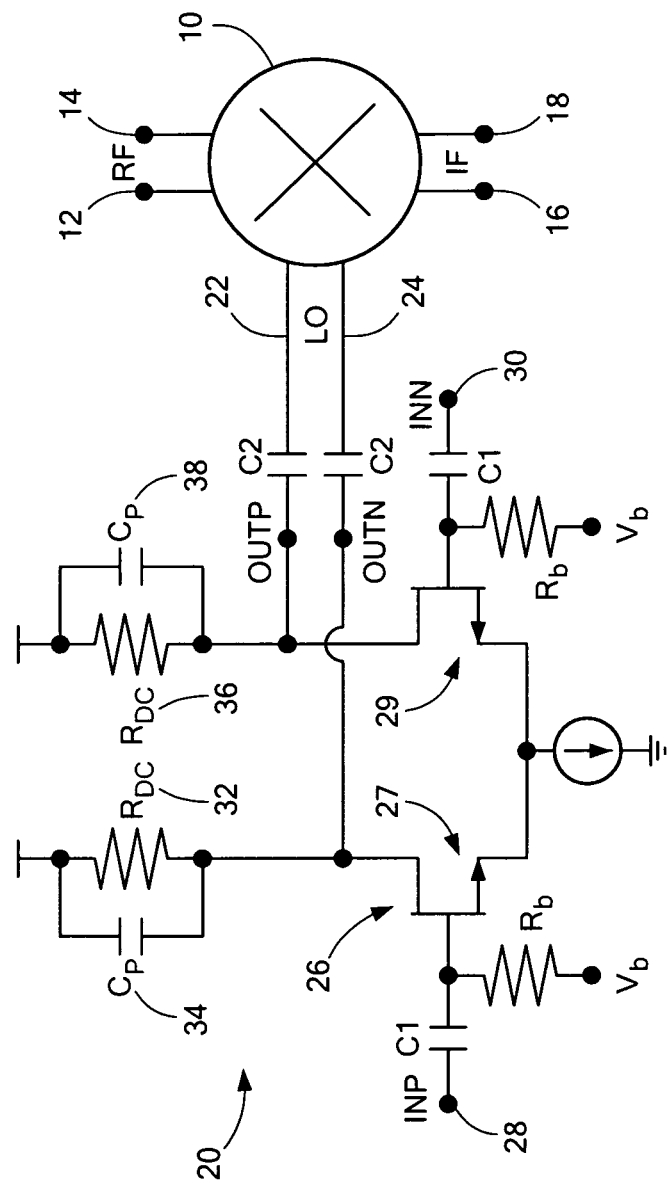
FIG. 1 is a circuit diagram of a conventional resistively loaded LO driver circuit connected to a mixer.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
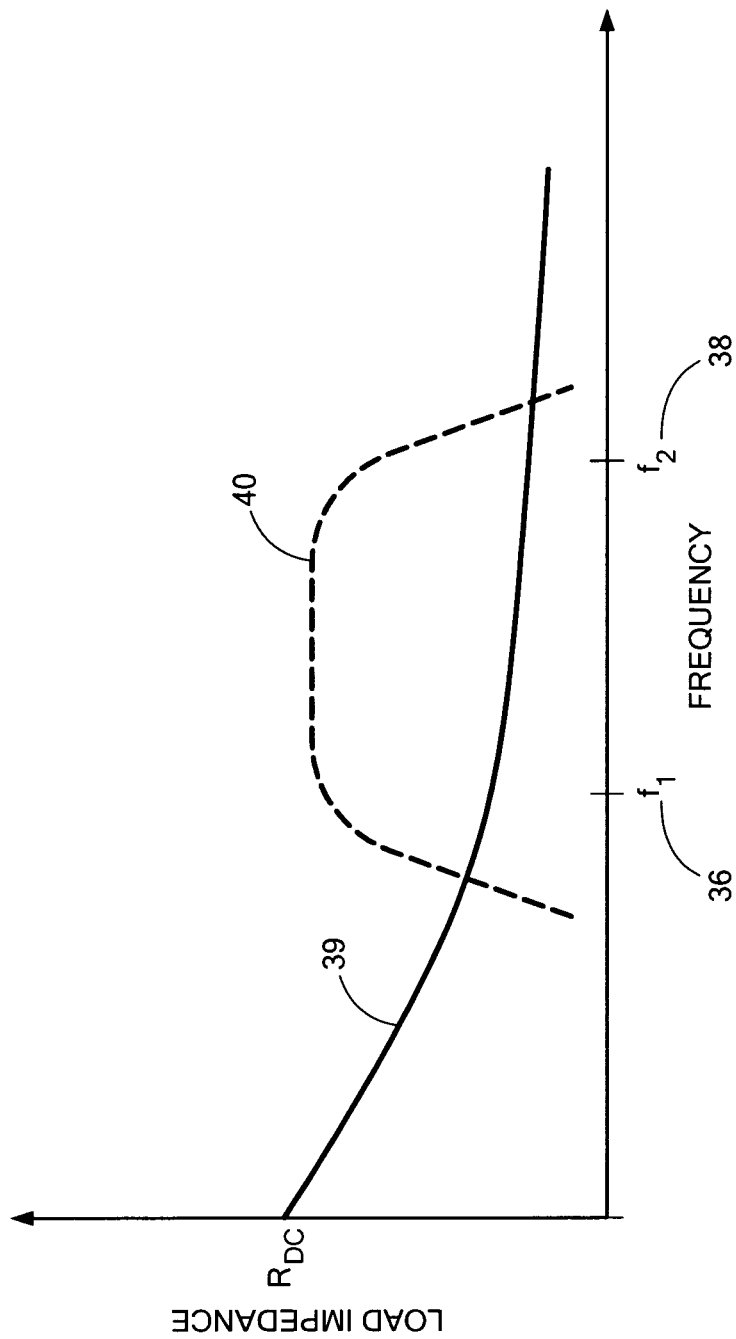
FIG. 2 depicts the load impedance behavior of the LO driver circuit shown in FIG. 1 over a predetermined LO frequency range.

As discussed in the Background section above, mixer 10, FIG. 1, e.g., a broadband mixer or similar type mixer, is often used in RF systems and microwave systems to down or up convert an RF signal received at inputs 12 and 14 into IF signal at outputs 16 and 18. The IF signal may be created by using LO driver circuit 20 which injects signals at LO inputs 22 and 24 to mixer 10. Conventional LO drive circuit 20 includes gain circuit 26 responsive to negative phase LO input signals INN at 28 and positive phase LO input signals INP at 30. LO driver circuit 20 is resistively loaded, e.g., as shown by the parallel combination of resistors $R_{DC}$-32 and capacitor $C_P$-34 and resistor $R_{DC}$-36 and capacitor $C_P$-38 connected to gain circuit 26 and LO inputs 22 and 24 as shown. As discussed in the Background section, LO driver circuit 20 needs provide a sufficiently large constant peak-to-peak voltage swing at LO inputs 22 and 24 to mixer 10 over the LO operating frequency range of LO driver circuit 20. However, as the input frequency to LO driver circuit 20 increases, parasitics, including parasitic capacitance, parasitic inductance, parasitic coupling, and parasitic resistance, herein referred to as "parasitics" associated with the various components of LO driver circuit, e.g., FETs 27 and 29, increase and reduce the load impedance of LO driver circuit 20. Graph 39, FIG. 2 shows an example of the reduced load impedance characteristics of LO driver circuit 20 over a predetermined LO frequency range between about $f_1$-36 to $f_2$-38. In one example, $f_1$-36 may be at a frequency of about 400 MHz and $f_2$-38 may be at a frequency of about 10 GHz. In another example, $f_1$-36 may be at a frequency of about 700 MHz and $f_2$-38 may be at a frequency of about 3.5 GHz. Other frequency ranges may also be used. As shown by graph 39, the load impedance of LO driver circuit 20 significantly reduces as the LO input frequency increases. Thus, LO driver circuit 20 may not provide the needed peak-to-peak voltage swing at LO inputs 22 and 24 at higher frequencies. Graph 40 shows one example of the desired constant impedance characteristics needed for a LO driver circuit over the predetermined LO frequency range between $f_1$-36 and $f_2$-38.

Figure 3:
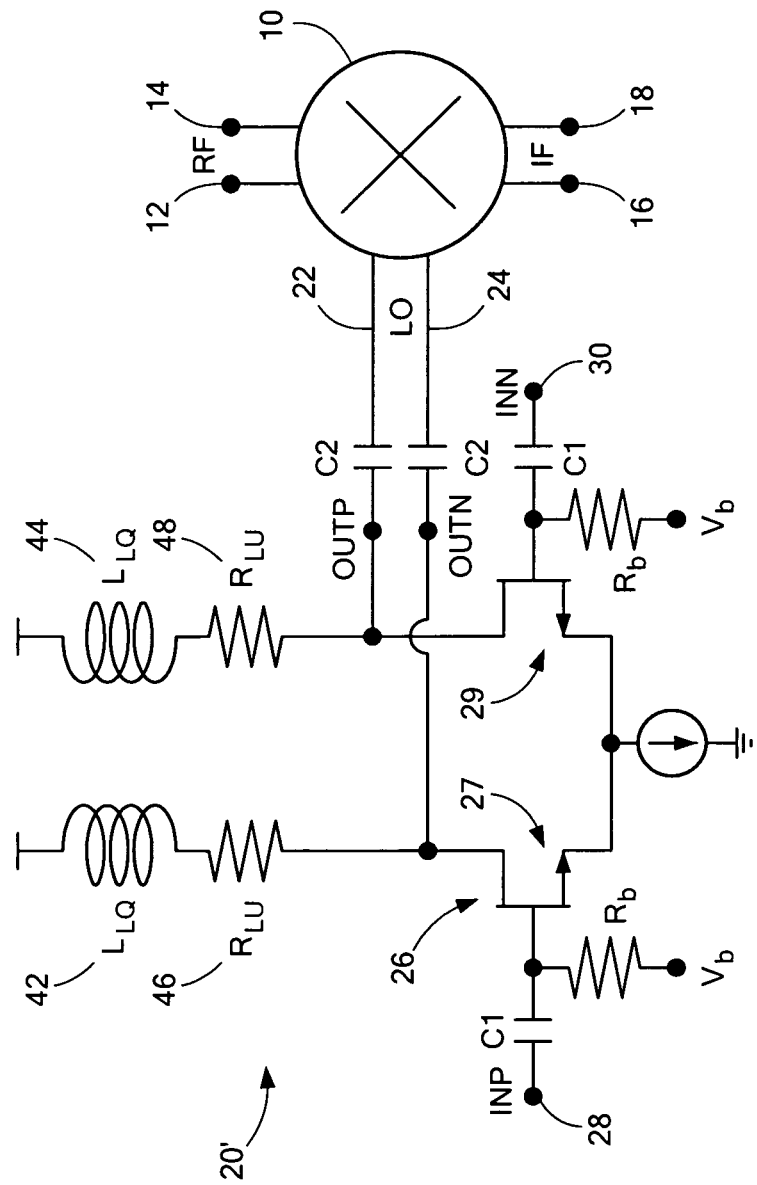
FIG. 3 is a circuit diagram of a conventional LO drive circuit with serially connected low quality factor load inductors and load resistors tuned for a lower frequency band.
Figure 4:
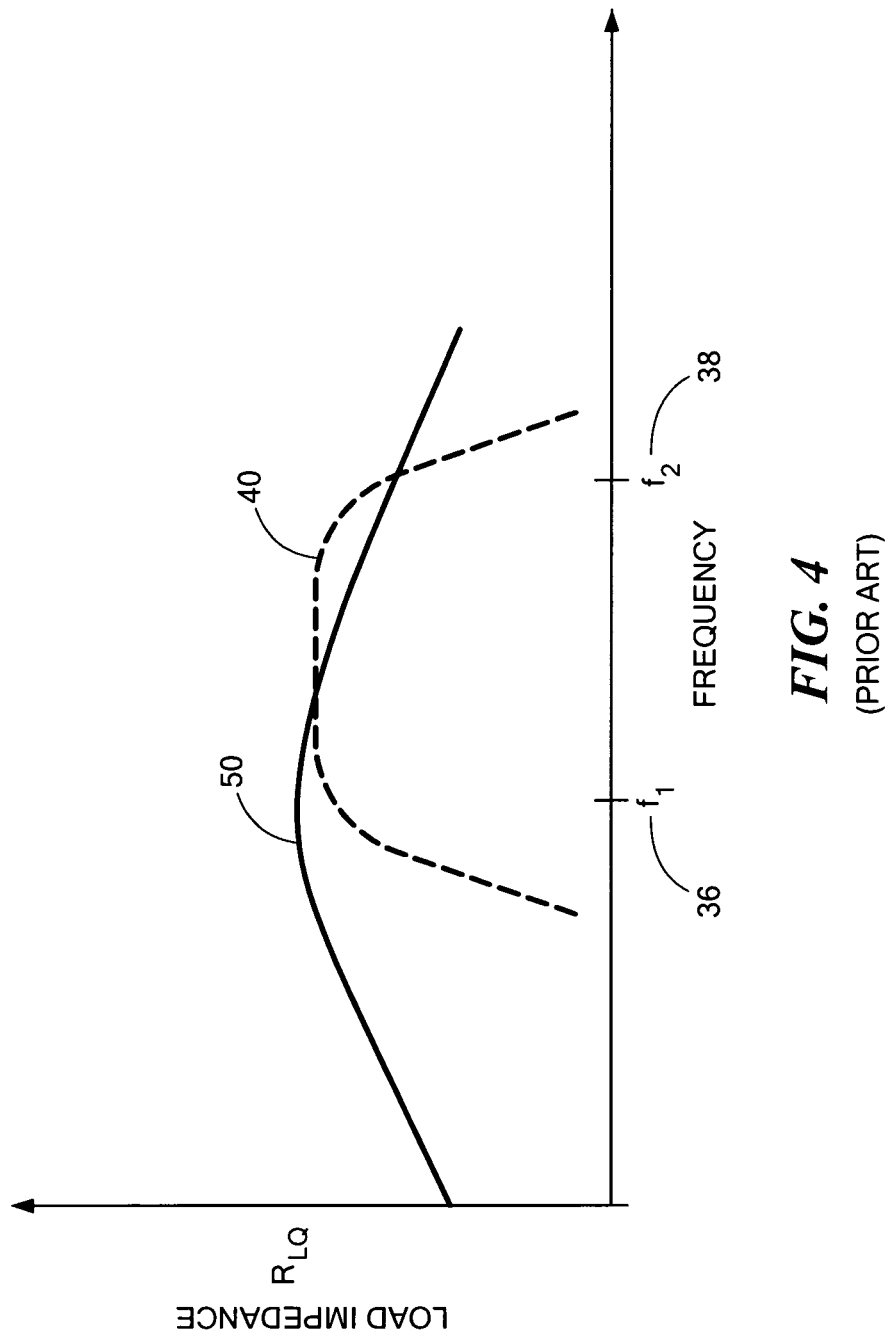
FIG. 4 depicts the load impedance behavior of the LO driver circuit shown in FIG. 3 over a predetermined LO frequency range.

To improve the impedance characteristics at lower frequencies, such as frequency $f_1$-36 or similar low frequency, conventional LO driver circuit 20', FIG. 3, where like parts have been given like numbers, may be inductively loaded with a single pair of low quality factor inductors $L_{LQ}$-42 and $L_{LQ}$-44, or a center tapped transformer or balun, connected in series with D-Q resistors $R_{LQ}$-46, $R_{LQ}$-48, respectively to define low frequency gain and overall bandwidth of LO driver circuit 20". As used herein, low quality factor inductors have more parasitics than high quality factor inductors. Similar as discussed above, parasitics associated LO driver circuit 20', e.g., the parasitics associated with the switching devices 27 and 29 and low quality factor inductors $L_{LQ}$-42 and $L_{LQ}$-44, result in the impedance characteristics shown in graph 50, FIG. 4, where like parts have been given like numbers. As can be seen, the impedance characteristics are improved at lower frequencies near $f_1$-36 but significantly reduce at higher frequencies near $f_2$-38.

Figure 5:
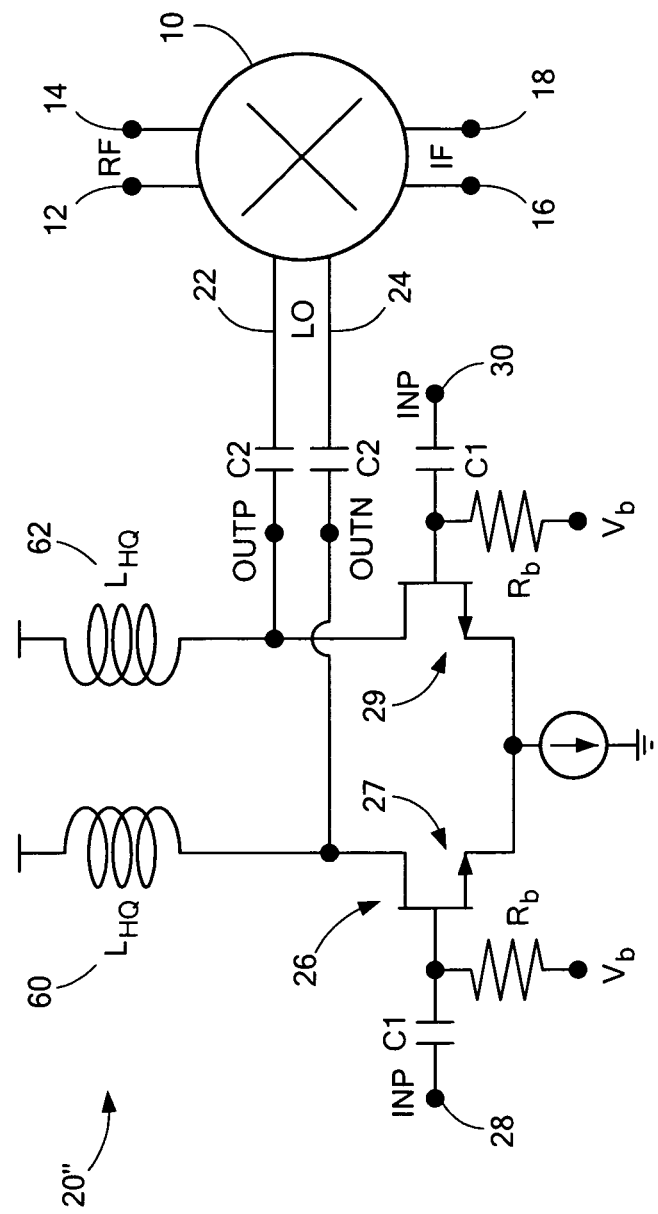
FIG. 5 is a circuit diagram of a conventional LO drive circuit loaded with high quality factor load inductors tuned for a higher frequency band.
Figure 6:
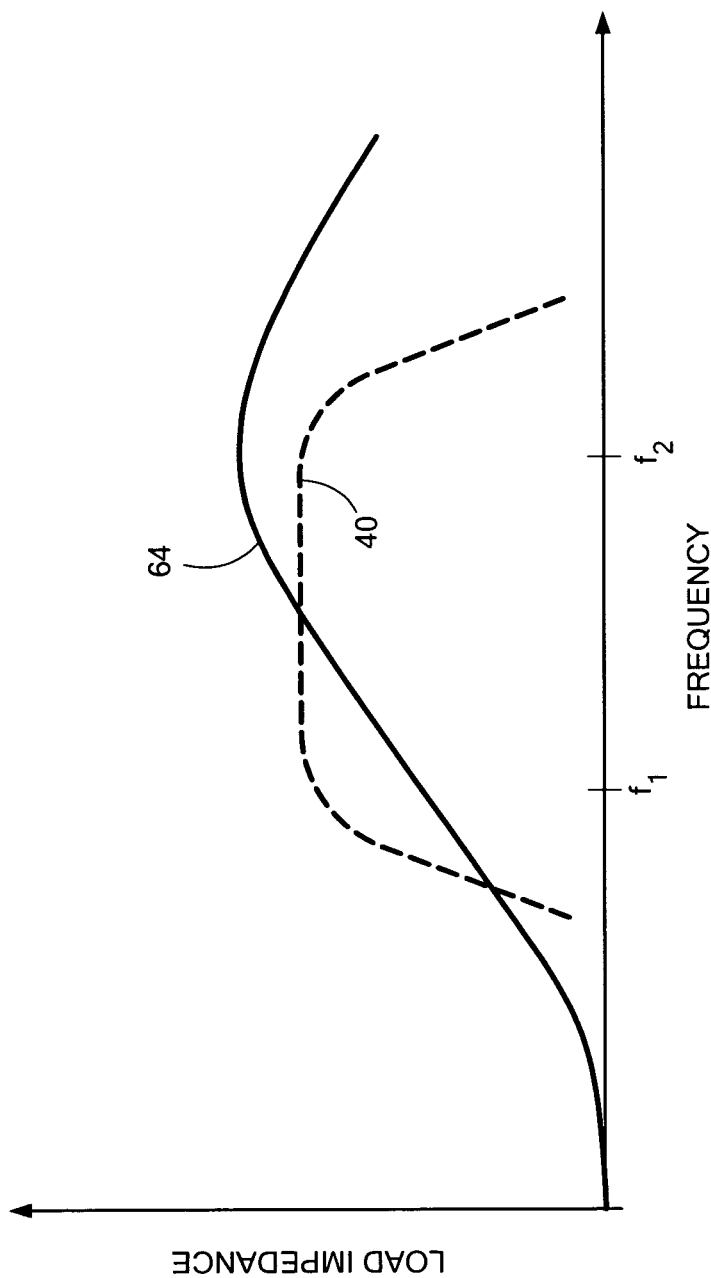
FIG. 6 depicts the load impedance behavior of the LO driver circuit shown in FIG. 5 over a predetermined LO frequency range.

To improve the impedance characteristics at higher frequencies, such as frequency $f_2$-38, or similar high frequencies, conventional LO driver circuit 20", FIG. 5, where like parts have been given like numbers, may be inductively loaded with a single pair of high quality factor inductors $L_{HQ}$-60 and $L_{HQ}$-62, or a center tapped transformer or balun, connected to gain circuit 26 and LO inputs 22 and 24. The parasitics associated with the LO driver circuit 20", e.g., the parasitics of switching devices 27 and 29 and high quality factor inductors $L_{HQ}$-60 and $L_{HQ}$-62, result in the output impedance characteristics shown in graph 64, FIG. 6, where like parts have been given like numbers. As can be seen, the impedance characteristics are improved at higher frequencies near $f_2$-38 but significantly reduce at lower frequencies near $f_1$-36.

Figure 7:
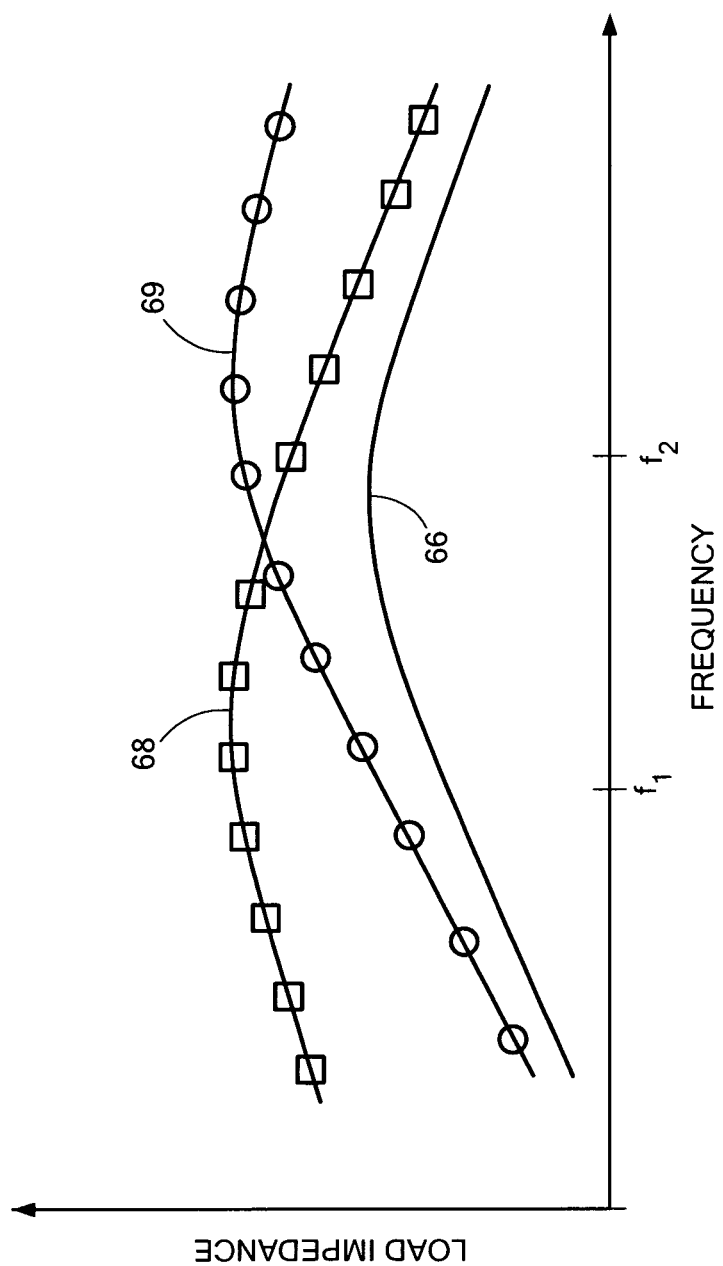
FIG. 7 depicts the load impedance behavior of parallel high quality factor load inductors, parallel low quality factor load inductors and the combination thereof over a predetermined LO frequency range.

The inventors hereof realized that if low quality factor inductors where connected in parallel with high quality factor inductors in a LO driver circuit, the resulting impedance would be a serial combination of the impedances of the low quality factor inductors and the high quality factor inductors. Graph 66, FIG. 7 shows an example of the combination of graph 68 representing the impedance characteristics low quality factor inductor impedance and graph 69 representing the impedance characteristic for high quality factor inductor impedance.

Figure 8:
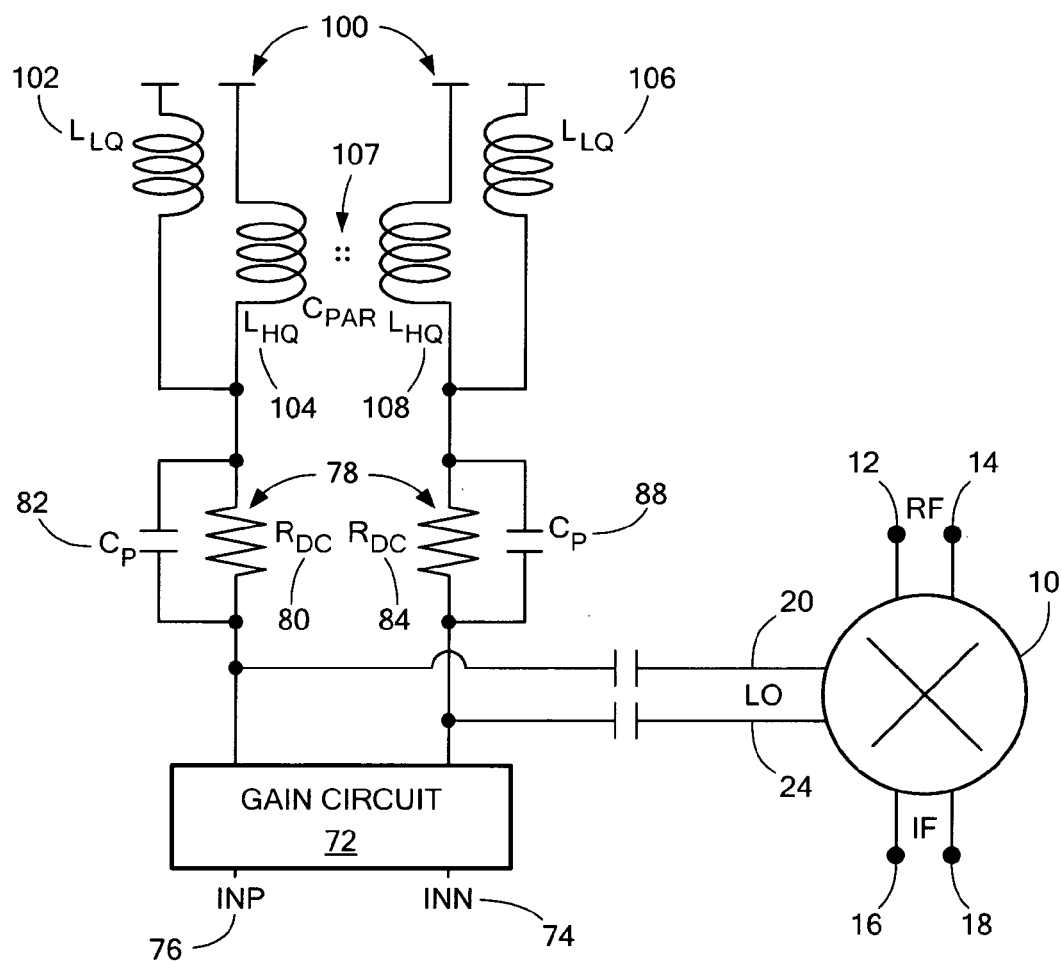
FIG. 8 is a circuit diagram of one embodiment of the improved LO driver circuit for a mixer of this invention.

Improved LO driver circuit 70 for a mixer, FIG. 8, where like parts have been given like numbers of one embodiment of this invention includes gain circuit 72 responsive to input signals INN at 74 and INP at 76. Gain circuit 72 may be similar to gain circuit 26 discussed above with reference to FIGS. 1, 3, and 5 or may have any type of design known to those skilled in the art. In one example, gain circuit 72 is response input signals at INN-74, INP-76 having a predetermined LO frequency range in the range of about 400 MHz, e.g., indicated at $f_1$-88, FIG. 9, to about 10 GHz, indicated at $f_2$-90. LO driver circuit 70, FIG. 8, also includes at least a first pair 78 of a parallel combination of resistor $R_{DC}$-80 and capacitor $C_P$-82 and resistor $R_{DC}$-84 and capacitor $C_P$-86 coupled to gain circuit 72 and LO inputs 20, 22 of mixer 10. Resistors $R_{DC}$-80, $R_{DC}$-84 are configured to increase the impedance of LO driver circuit 70 at low frequencies, e.g., near $f_1$-88, FIG. 9. Capacitors $C_P$-82, $C_P$-86 are configured to short the respective resistor-capacitor pair at high frequencies, e.g., near $f_2$-90, to reduce resistive impendence of resistors $R_{DC}$-80, $R_{DC}$-84.

LO driver circuit 70 also includes at least a second pair 100 of a parallel combination of low quality factor inductor $L_{LQ}$-102 and high quality factor inductor $L_{HQ}$-104 and a parallel combination of low quality factor inductor $L_{LQ}$-106 and high quality factor inductor $L_{HQ}$-108. Second pair 100 is connected to first pair 78 as shown. $L_{HQ}$-104 and $L_{HQ}$-108 may be configured as center tapped transformer or a balun as shown at 109. Second pair 100 in serial combination with first pair 78 is tuned to provide a constant desired load impedance and a constant desired voltage swing of the signals at LO inputs 20, 22 over the predetermined LO frequency range. The tuning may include determining the impedance and parasitics for $L_{LQ}$-102, $L_{LQ}$-106, $L_{HQ}$-104, $L_{HQ}$-108, $C_P$-82 and $C_P$-86 by simulation to achieve the constant desired load impedance and the constant desired voltage swing over the predetermined LO frequency range. In one example, $L_{LQ}$-102 and $L_{LQ}$-106 may have an inductance of about 3.7 nH and a parasitic resistance of about 82.3Ω LHQ-104 and $L_K$-108 may have an inductance of about 5.6 nH and a parasitic resistance of about 3.4 n and $C_P$-82 and $C_P$-86 may have a capacitance of about 1 pF and a parasitic resistance of about 0.2Ω to achieve the desired impedance characteristics of LO driver circuit 70, as discussed below.

Figure 9:
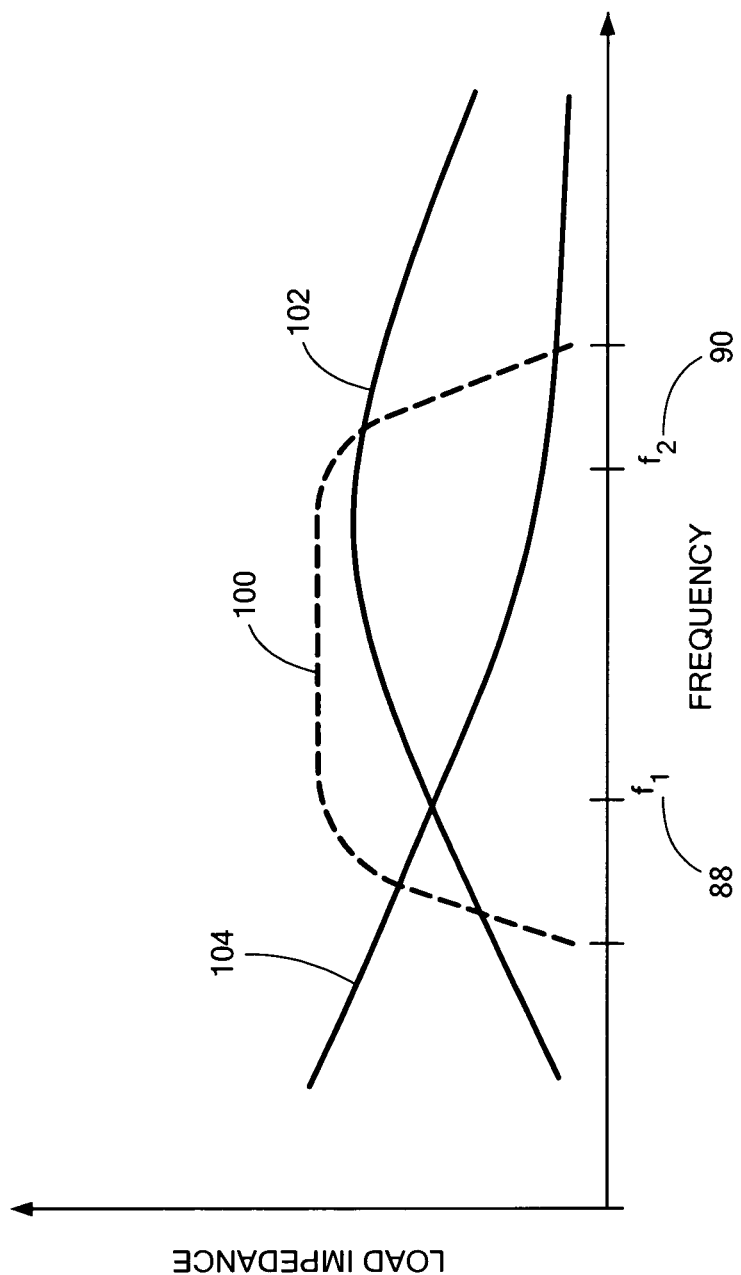
FIG. 9 depicts one example of the load impedance behavior of the LO driver circuit shown in FIG. 8 over a predetermined LO frequency range.

Graph 100, FIG. 9, shows one example of the constant load impedance characteristics generated by LO driver circuit 70 over the predetermined LO frequency range between $f_1$-88 and $f_2$-90. Graph 100 results from a combination of graph 102 and graph 104. In this example, graph 102 represents the impedance characteristics of the parallel equivalent of the inductive loads of pair 100, FIG. 8, of the parallel combination of $L_{LQ}$-102, $L_{HQ}$-104 and LLQ-106, $L_{HQ}$-108 and graph 104 represents the impedance characteristics of pair 78 of $R_{DC}$-80, $C_P$-82 and $R_{DC}$-84, and $C_P$-86. Thus, LO driver circuit 70 provides a desired constant load impedance over the LO frequency range between about $f_1$-88, FIG. 9, and about $f_2$-90. In one example, LO driver circuit may have an absolute constant output impedance of about 50Ω. However, this is for exemplary purposes only, as the desired constant load impedance may be different for other embodiments of LO driver circuit 70, as known by those skilled in the art. The result is LO driver circuit 70, FIG. 8, provides a constant desired voltage swing of the signals at LO inputs 20, 22 over the predetermined LO frequency range between about $f_1$-88, FIG. 9, and about $f_2$-90. In one example, the constant desired voltage swing of the signals at LO inputs 20, 22 may have a single-ended peak-to-peak voltage in the range of about 0.5 V to about 3 V and the predetermined LO frequency range may be between about 400 MHz and about 10 GHz, as discussed above. Other examples of the LO frequency range and constant desired voltage are known to those skilled in the art. The result is LO driver circuit 70 is a significant improvement over conventional LO driver circuits discussed above, which typically operate at a LO frequency range of only about 600 MHz to about 1,700 MHz and set the control voltage of the mixer for each frequency to obtain the best IP3 and conversion gain.

Figure 10:
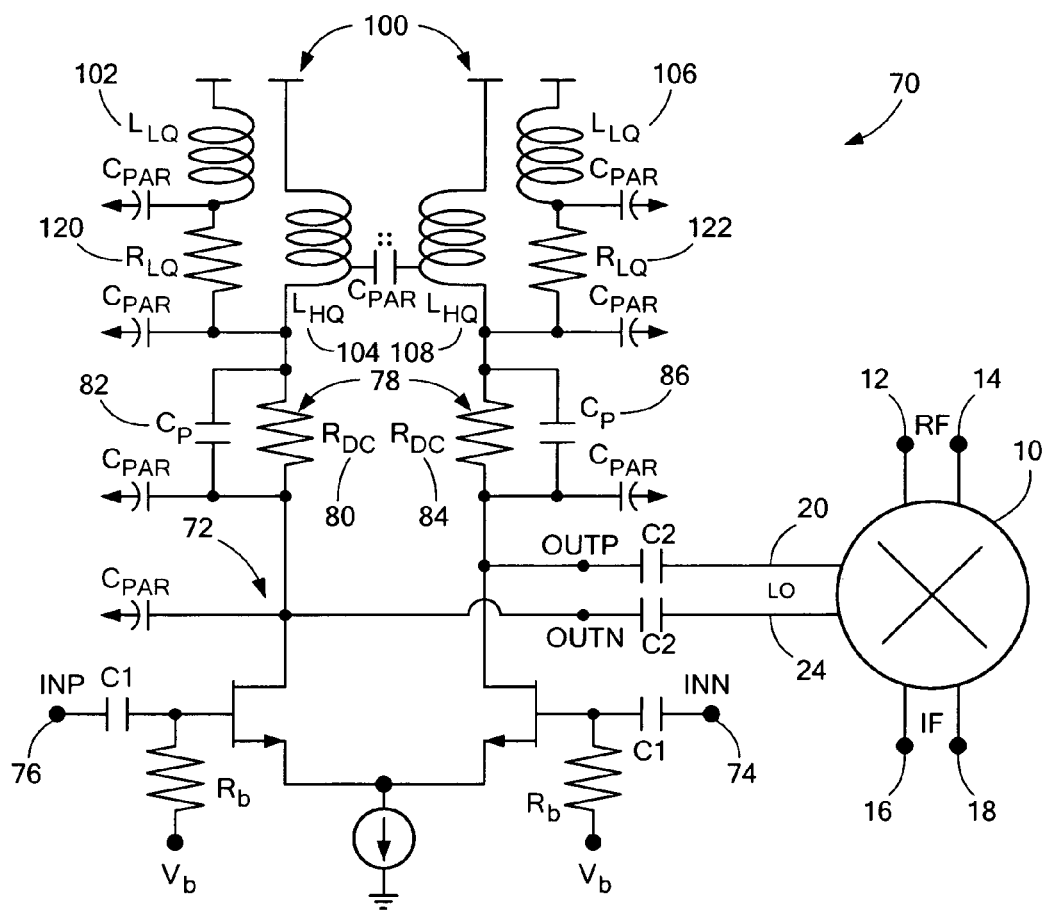
FIG. 10 is circuit diagram showing in further detail the primary components of the LO driver circuit shown in FIG. 9 and showing an example of load resistor connected to each of the low quality factor inductors shown in FIG. 8.

LO driver circuit 70', FIG. 10, where like parts include like numbers, is similar to LO driver circuit 70, FIG. 8, except this example, LO driver circuit 70', FIG. 10, includes resistor $R_{LQ}$-120 connected in series with low quality factor inductor $L_{LQ}$-102 and resistor $R_{LQ}$-122 connected in series with low quality factor inductor $L_{LQ}$-106 as shown to provide the load impedance characteristics shown by curve 102, FIG. 9. In this example, the resistance of $R_{LQ}$-120 and $R_{LQ}$-122 is used instead of the parasitic resistance of $L_{LQ}$-102 and $L_{LQ}$-106, as discussed above with reference to FIG. 8. In this example, $R_{LQ}$-120 and $R_{LQ}$-122 may each have a resistance of about 75Ω and $L_{LQ}$-102 and $L_{LQ}$-106 the same inductance as discussed above (3.7 nH) but have a parasitic resistance of about 7.30 Ω.

In this example, LO driver circuit 70 includes gain circuit 72 having the design as shown. Other designs for gain circuit 72 are known. The parasitic capacitance for $L_{LQ}$-102, $L_{LQ}$-106, LHQ-104, $L_{HQ}$-108, $C_P$-82, and $C_P$-86 are indicated as $C_{PAR}$.

Figure 11:
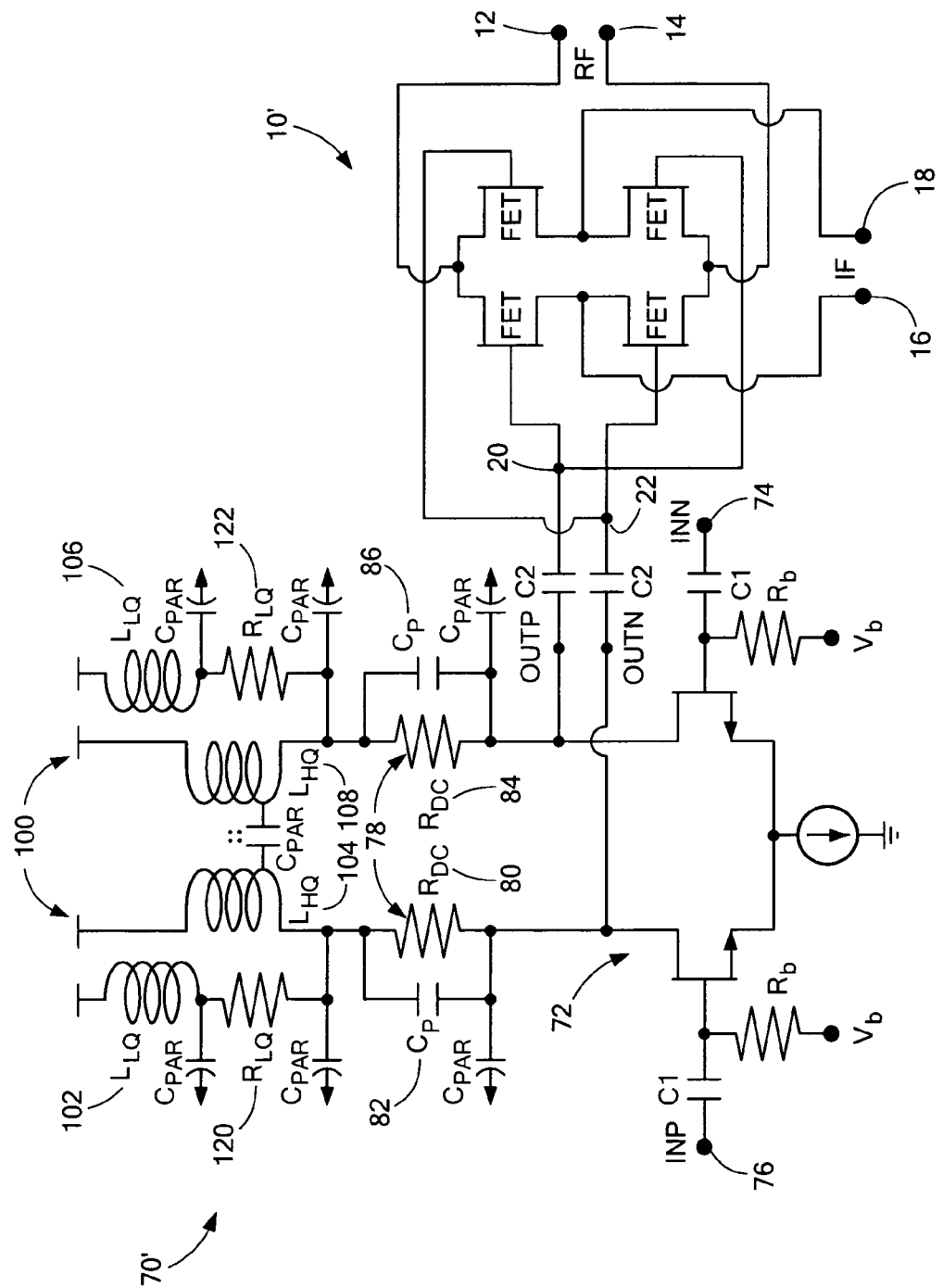
FIG. 11 is a circuit diagram showing the LO driver circuit shown in FIG. 10 connected to a FET mixer in accordance with one embodiment of this invention.

In one example, mixer 10, FIG. 11, where like parts have been given like numbers may be configured as a FET mixer as shown.

Figure 12:
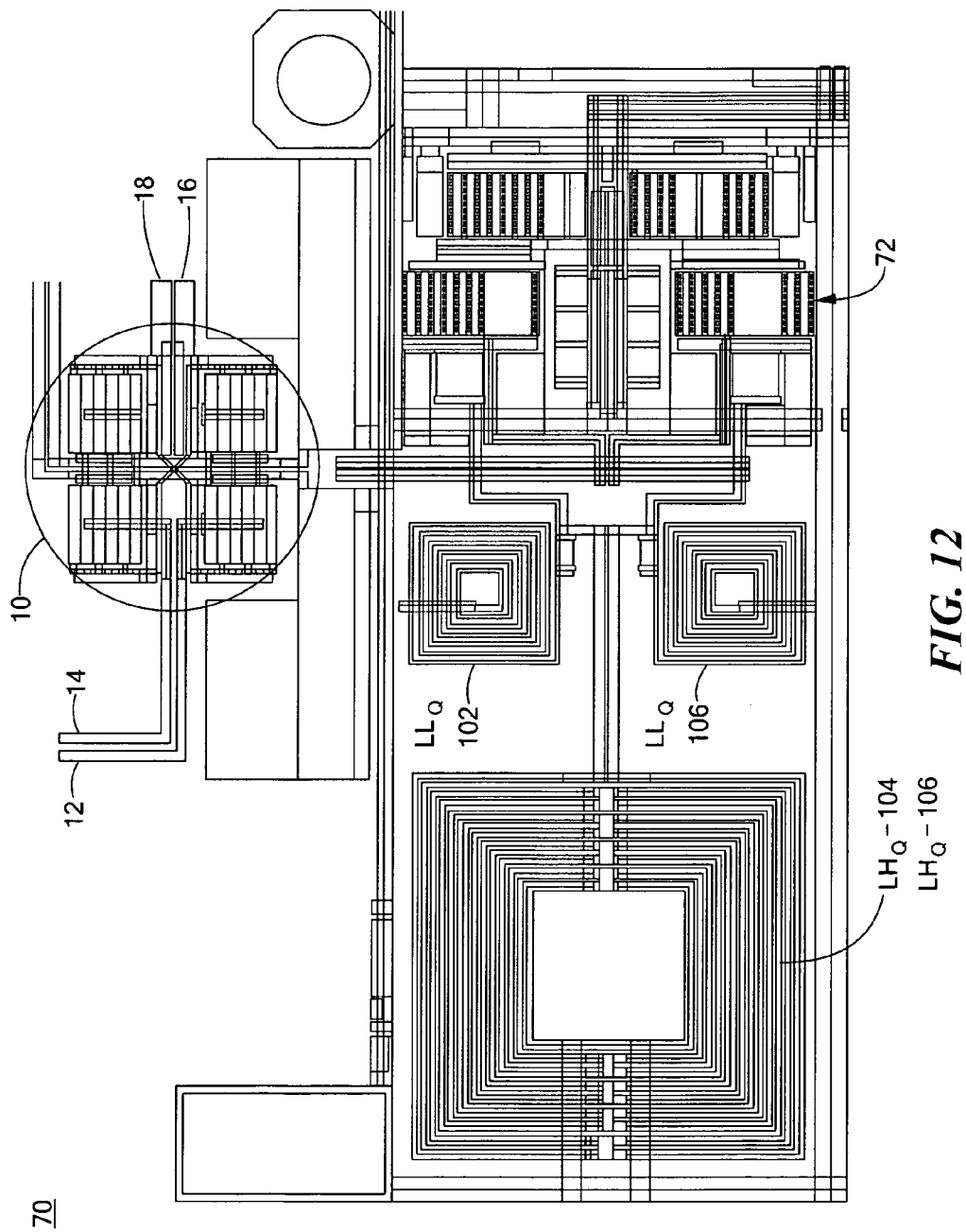
FIG. 12 is a schematic diagram showing one example of an integrated circuit layout for the LO driver circuit shown in one or more of FIGS. 8-11.

FIG. 12, where like parts have been given like numbers shows one exemplary integrated circuit layout of the primary components of LO driver circuit 70, e.g., $L_{LQ}$-102, $L_{LQ}$-106, $L_{HQ}$-104, $L_{HQ}$-106, gain circuit 72, and a mixer 10.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An improved local oscillator (LO) driver circuit for a mixer, the LO driver circuit comprising:
    a gain circuit responsive to LO input signals at a predetermined LO frequency range;
    at least a first pair of a parallel combination of a resistor and a capacitor coupled to the gain circuit and to LO inputs of the mixer, the resistor configured to increase impedance at low frequencies of the frequency range and the capacitor configured to reduce the impedance of the first parallel combination at high frequencies of the frequency range; and
    at least a second pair of a parallel combination of a low quality factor inductor and a high quality factor inductor connected to the first pair, the second pair in serial combination with the first pair tuned to provide a constant desired load impedance and a constant desired voltage swing at the LO inputs of the mixer over the predetermined LO frequency range.

2. The LO driver circuit of claim 1 in which each low quality factor inductor of the second pair has a predetermined inductance and predetermined parasitics.

3. The LO driver circuit of claim 1 in which the low quality factor inductors of the second pair are inductively coupled to each other.

4. The LO driver circuit of claim 1 in which each high quality factor inductor of the second pair has a predetermined inductance and predetermined parasitics.

5. The LO driver circuit of claim 1 in which the high quality factor inductors of the second pair are inductively coupled to each other.

6. The LO driver circuit of claim 1 in which each capacitor of the first pair has a predetermined capacitance and predetermined parasitics.

7. The LO driver circuit of claim 1 further including a resistor connected in series with each low quality factor inductor tuned to provide the constant desired load impedance and the constant desired voltage swing.

8. The LO driver circuit of claim 7 in which the resistor has a predetermined resistance and predetermined parasitics.

9. The LO driver circuit of claim 1 in which the predetermined LO frequency range includes a frequency range in the range of about 400 MHz to about 10 GHz.

10. The LO driver circuit of claim 1 in which the predetermined LO frequency range includes a frequency range of about 600 MHz to about 3.5 GHz.

11. The LO driver circuit of claim 1 in which the constant desired voltage swing includes a single-ended peak-to-peak voltage in the range of about 0.5 to about 3 V.

12. An improved local oscillator (LO) driver circuit for a mixer, the LO driver circuit comprising:
    a gain circuit responsive to LO input signals at a predetermined LO frequency range;
    at least a first pair of a parallel combination of a resistor and a capacitor coupled to the gain circuit and to LO inputs of the mixer, the resistor configured to increase impedance at low frequencies of the frequency range and the capacitor configured to reduce the impedance of the parallel combination at high frequencies of the frequency range; and
    at least a second pair of a parallel combination of a high quality factor inductor connected in parallel with a series combination of a low quality factor inductor and a resistor connected to the first pair, the second pair in serial combination with the first pair tuned to provide a constant desired load impedance and a constant desired voltage swing of the signals at the LO inputs of the mixer over the predetermined LO frequency range.

13. The LO driver circuit of claim 12 in which each low quality factor inductor of the second pair has a predetermined inductance and predetermined parasitics.

14. The LO driver circuit of claim 12 in which the low quality factor inductors of the second pair are inductively coupled to each other.

15. The LO driver circuit of claim 12 in which each high quality factor inductor of the second pair has a predetermined inductance and predetermined parasitics.

16. The LO driver circuit of claim 12 in which the high quality factor inductors of the second pair are inductively coupled to each other.

17. The LO driver circuit of claim 12 in which each capacitor of the first pair has a predetermined capacitance and predetermined parasitics.

18. The LO driver circuit of claim 12 in which the resistor has a predetermined resistance and predetermined parasitics.

19. The LO driver circuit of claim 12 in which the predetermined LO frequency range includes a frequency range in the range of about 400 MHz to about 10 GHz.

20. The LO driver circuit of claim 12 in which the predetermined LO frequency range includes a frequency range of about 600 MHz to about 3.5 GHz.

21. The LO driver circuit of claim 12 in which the desired constant voltage swing includes a single-ended peak-to-peak voltage in the range of about 0.5 V to about 3 V.

* * * * *